United States Patent [19]

Day

[11] Patent Number: 5,668,745
[45] Date of Patent: Sep. 16, 1997

[54] METHOD AND APPARATUS FOR TESTING OF SEMICONDUCTOR DEVICES

[75] Inventor: Chris Day, Mt. View, Calif.

[73] Assignee: LSI Logic Corporation, Milpitas, Calif.

[21] Appl. No.: 545,879

[22] Filed: Oct. 20, 1995

[51] Int. Cl.$^6$ .................................................. G06F 11/00
[52] U.S. Cl. ..................... 364/580; 364/488; 364/490; 364/579; 395/919; 395/920; 371/22.6; 371/27.1
[58] Field of Search ..................................... 364/580, 488, 364/490, 579; 395/919, 920; 371/22.6, 27

[56] References Cited

U.S. PATENT DOCUMENTS

| | | | |
|---|---|---|---|
| 3,764,995 | 10/1973 | Helf, Jr. et al. | 340/172.5 |
| 4,888,715 | 12/1989 | Tada et al. | 364/550 |
| 4,894,829 | 1/1990 | Monie et al. | 371/20.1 |
| 5,258,932 | 11/1993 | Matsuzaki | 364/578 |
| 5,446,742 | 8/1995 | Vahabi et al. | 371/27 |
| 5,539,652 | 7/1996 | Tegethoff | 364/490 |
| 5,550,971 | 8/1996 | Brunner et al. | 395/161 |

*Primary Examiner*—Emanuel T. Voeltz
*Assistant Examiner*—Hien Vo
*Attorney, Agent, or Firm*—Matthew G. Reeves

[57] ABSTRACT

A computer-based method is provided for determining whether a semi-conductor device conforms to design requirements. In one embodiment, the method is based on data stored in a design database, and an automatic test equipment ("ATE") datalog. In a further embodiment, the method includes generating a requirements datalog responsive to the design database, generating a standard datalog responsive to the automatic test equipment datalog, and generating a conformance indication responsive to the requirements datalog and the standard datalog.

11 Claims, 7 Drawing Sheets

| 306 | 308 | 310 | 312 |
|---|---|---|---|
| Functional | Test Name | Test Pattern | VDD |

FIG. 3A

| 314 | 316 | 318 | 319 | 320 | 322 | 324 |
|---|---|---|---|---|---|---|
| Parametric | Test Name | Signal Name | Positive Limit | Negative Limit | Forcing Value | VDD |

FIG. 3B

METHOD AND APPARATUS FOR TESTING OF SEMICONDUCTOR DEVICES

BACKGROUND OF THE INVENTION

The present invention relates to testing semiconductor devices, and more particularly, for a method for testing semiconductor devices by comparing test results from automatic test equipment ("ATE") against a design requirement data base.

Semiconductor devices, or integrated circuits are susceptible to a wide variety of defects at all stages of their manufacture. Therefore, before semiconductor circuits are shipped to the customer, they are tested. A wide variety of tests are performed including continuity tests, in which a current is applied to each signal pin on the device and the voltage drop across the pin's protective diode is measured, quiescent current test in which the static IDD current drawn by the device is measured, functional tests, in which data is presented to the inputs of the device and the outputs are tested for the correct logic levels, short circuit tests, and leakage tests. Those of skill in the art will recognize that these represent just some of the tests performed on a semiconductor device, and that combinations of some tests are applied to some pins on the device. For example, pins used with bi-directional signals, require both input and output tests to be performed.

Automatic test equipment for performing tests such as those described above is commercially available. Examples of useful equipment are the STS 6120, STS 8256, Vista LT and Vista Logic, all manufactured by Credence Systems Corporation. Other suitable ATE is also available and additional examples will occur to those of skill in the art.

FIG. 1 is a flow chart of the steps involved in testing a semiconductor device with a typical ATE. Initially, as shown in step 100, the design data base is generated for the device. The designed data base contains all the information required to manufacture a semiconductor device, including stimulation data needed to verify the operation of the device. In general, the design data base consists of a "netlist" which describes the actual circuitry, libraries containing data on the various elements which comprise the design, such as parameters for external signals, and the stimulation data referred to previously.

Information contained in the design data base 100 is then provided to the test program generator 102. The test program generator 102 generates a test program from the design database which will be executed by the ATE. The test program typically includes a database of external signals and their type, thereby determining what tests need to be performed, and the appropriate executable program code for the automatic test equipment. The test program 104 generated by the test program generator is then loaded into the automatic test equipment 106. Next, the device under test 110 is connected to the automatic test equipment 106, and the test program 104 is executed.

The result of each test performed on device 110 by ATE 106 is stored in the ATE data log 108. When the test is complete, the results of the test in the ATE data log 108 are compared to the design requirements in the design database 100 to determine whether the device has performed satisfactorily on each test.

However, although the ATE datalog 108 contains a record of the device's performance on each test, difficulty exists in analyzing this data. For example, one method of analyzing the data contained in the ATE datalog is to print the ATE datalog onto paper for review by an operator. The operator then compares the printout with a corresponding printout of the design requirements to determine whether the design is satisfactory. However, this method is slow, cumbersome and prone to human error. Another method for analyzing the data from the ATE datalog is to enter the design requirements into a computer, and then compare the ATE datalog with these requirements. However, entering the requirements into a computer is a difficult requirement because numerous comparisons or checks must be made. For example, all required functional tests performed and the appropriate start and stop memory locations used for the functional tests must be recorded.

Also, it is important that a measurement exists for each test and for each signal as required. Further still, for each test, it must be verified that the correct forcing value and correct test limits were used. If a test result is missing in the standard datalog file, or a forcing value or limit is incorrect, the analysis of the data contained in the ATE datalog is unreliable. Therefore, this method lends itself to error because the design requirements often fail to exactly match the tests performed. Accordingly, it is an object of the present invention to overcome the above-mentioned problems in the art.

SUMMARY OF THE INVENTION

A computer-based method is provided for determining whether a semiconductor device conforms to design requirements. In one embodiment, the method is based on data stored in a design database and an automatic test equipment ("ATE") datalog. In a further embodiment, the method comprises generating a requirements datalog responsive to the design database, generating a standard datalog responsive to the automatic test equipment datalog, and generating a conformance indication responsive to the requirements datalog and the standard datalog.

In another embodiment of the invention, the method involves using a computer system having a data processing unit operative with a memory, data retrieval circuitry and a user interface to determine whether a semiconductor device conforms to design requirements based on data stored in a design database and an automatic test equipment datalog. In one version of the invention, the method comprises retrieving design database data from the design database, and storing the design database data into the memory, retrieving ATE data from the automatic test equipment datalog and storing the ATE data into the memory, generating a requirements datalog in the memory, the requirements datalog being responsive to the design database data, generating a standard datalog in the memory, the standard datalog being responsive to the ATE data, generating a conformance indication responsive to the requirements datalog and the standard datalog, and providing the conformance indication to the user interface.

BRIEF DESCRIPTION OF THE DRAWINGS

For a more complete understanding of the invention, and for further advantages thereof, reference is made to the following detailed description taken in conjunction with the accompanying drawings, in which:

FIGS. 3A–3B are block diagrams of fields according to the present invention.

It is to be noted, however, that the appended drawings illustrate only typical embodiments of this invention, and are therefore not to be considered limiting of its scope, for the invention may admit to other equally effective embodiments.

DETAILED DESCRIPTION OF EMBODIMENTS OF THE INVENTION

Figure 1:
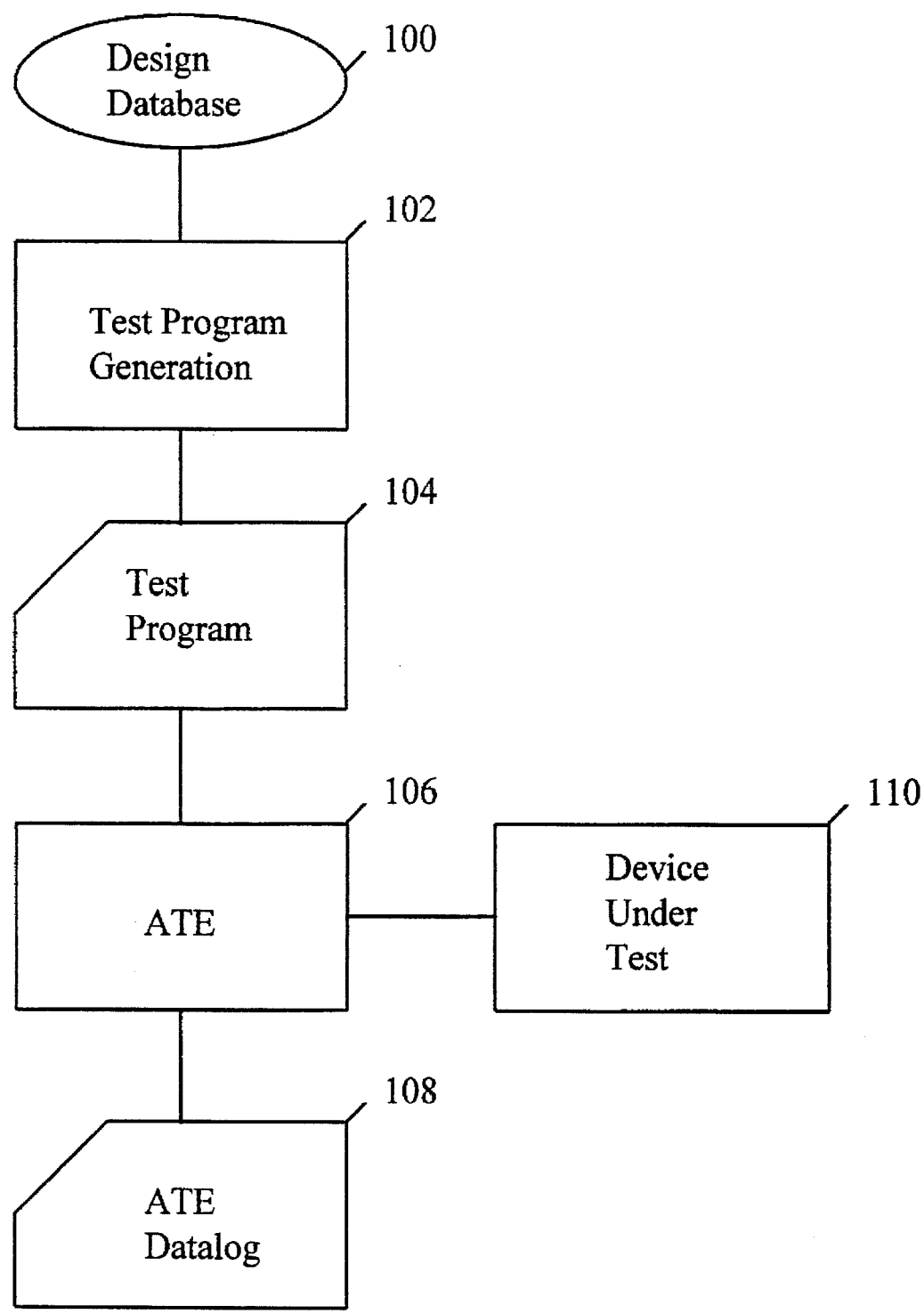
FIG. 1 is a flow chart showing the generation of a typical ATE datalog.
Figure 2:
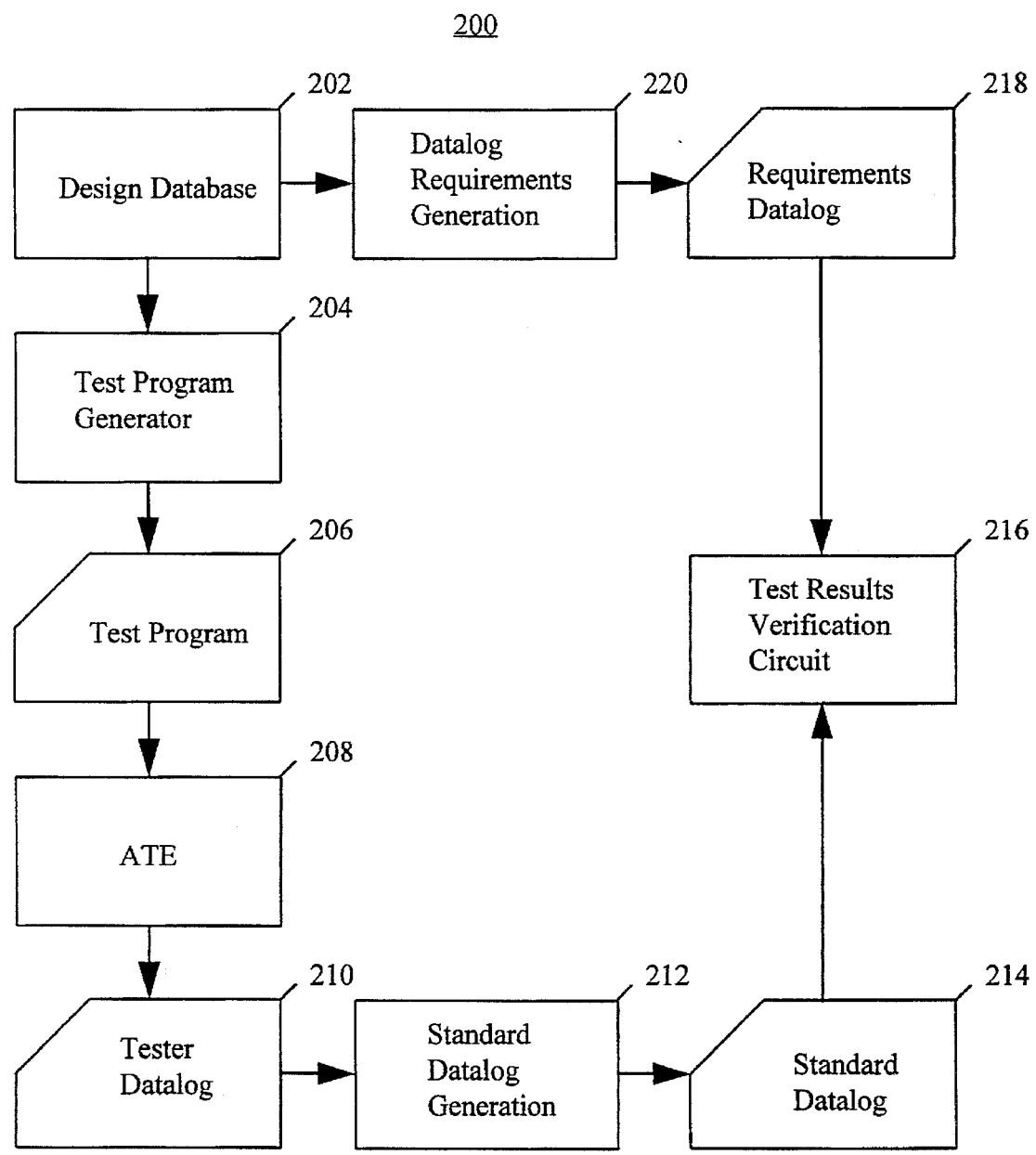
FIG. 2 is a flow chart showing a method according to an embodiment of the invention.

Referring now to FIG. 2, a flow chart is provided showing a computer-based method for determining, based on data stored in a design database and an automatic test equipment datalog, whether a semiconductor device conforms to design requirements. As seen in the left hand side of the figure, the design database 202 provides design data to a test program generator 204 which generates a test program 206 for execution by the automatic test equipment 208. The automatic test equipment 208 then performs the tests specified in test program 206 on a semiconductor device (not shown) and stores the results of these tests in the tester, or ATE datalog 210. Steps 202–210 are performed in substantially the same way as steps 100–108 described previously with respect to FIG. 1.

However, according to an embodiment of the present invention, steps are provided for making a "closed loop" determination of whether the semiconductor device being tested conforms to design requirements. As used herein, closed loop means that the data required for testing the device and the data required for verifying the test results are generated solely from the design database, without additional input from other sources. In one embodiment, the method comprises generating a requirements datalog 218 responsive to the design database 202. In the embodiment shown in FIG. 2, this step is performed by a datalog requirements generator 220.

Figure 2A:
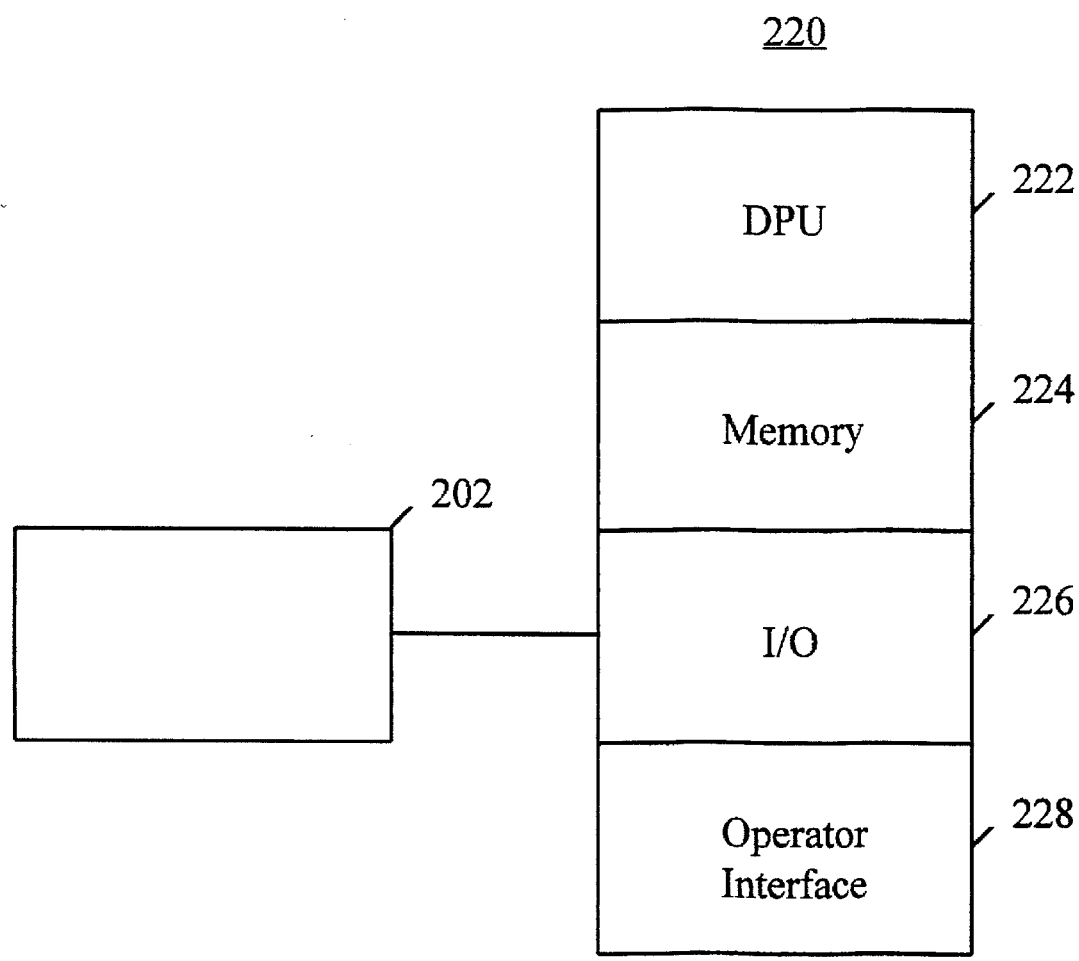
FIG. 2A is a block diagram of a datalog requirements generator according to an example embodiment of the invention.

FIG. 2A shows an embodiment of a datalog requirements generator 220 according to an embodiment of the invention. In this version, the datalog requirements generator 220 comprises a data processing unit (DPU) 222 in connection with memory 224, data retrieval circuitry, or I/O, 226, and an operator interface 228. In this version, I/O 226 retrieve data from the design database 202. This step is not critical, and is performed in any convenient manner depending on the actual computer components used. For example, in one embodiment, the design database 202 is supplied to the I/O 226 as a file stored on a magnetic disk. In an alternative embodiment, the design database 202 is supplied to the I/O by computer communications, such as an RS-232 interface.

In yet a further embodiment, the datalog requirements generator shares a common data processing unit with the computer used to generate the design database and thus, the design database is supplied to the datalog requirements datalog via an internal data bus.

Once the I/O 226 has retrieved the data from the design database 202, it is accessed by DPU 222. DPU 222 then formats the data from design database 202 as described more fully below, and then stores the formatted data into memory, 224. In another embodiment, the datalog requirements generator 220 is provided with an operator interface 228, including, for example, a keyboard and a display for allowing user access and control of the datalog requirements generator 220. Those of skill in the art will recognize that exact computer equipment to be used is not critical, and a wide variety of computer platforms may be configured to function suitably as a datalog requirements generator.

Referring again to FIG. 2, the requirements datalog 218 generated by the datalog requirements generator 220 are stored in a data structure accessible by the test result verification circuit 216. The exact form of the data structure for storing the requirements datalog is not critical, and variations are limited only by the imagination of the programmer. Examples of useful data structures are described with respect to FIGS. 3, 3A and 3B.

In one embodiment, the datalog requirements generator 220 operates in substantially the same manner as the test program generator 204. For example, as discussed previously, the test program generator 204 determines which test will be performed by the ATE 208 and then generates the appropriate executable code. In this embodiment, datalog requirements generator 220 determines which test will be performed by the ATE 208 in the same manner as the test program 204. Therefore, there will naturally be a one-to-one correspondence between each test performed by the ATE and the necessary data for verifying that the device performed in conformance with the design requirements for that test. Of course, there is no need for the datalog requirements generator to generate any ATE executable code, therefore, programming overhead is reduced. Determining which tests will be performed by the ATE based on the design database is done according to techniques known to those of skill in the art. For example, in one version of the invention, the datalog requirements generator 220 gathers the data for each pin of the device, then categorizes each pin based on the pin type, for example, I/O, VDD, etc. Based on the type of pin, the type of test to be performed are determined from an appropriate data table. Other techniques will occur to those of skill in the art such as those based on circuit configuration.

Figure 3:
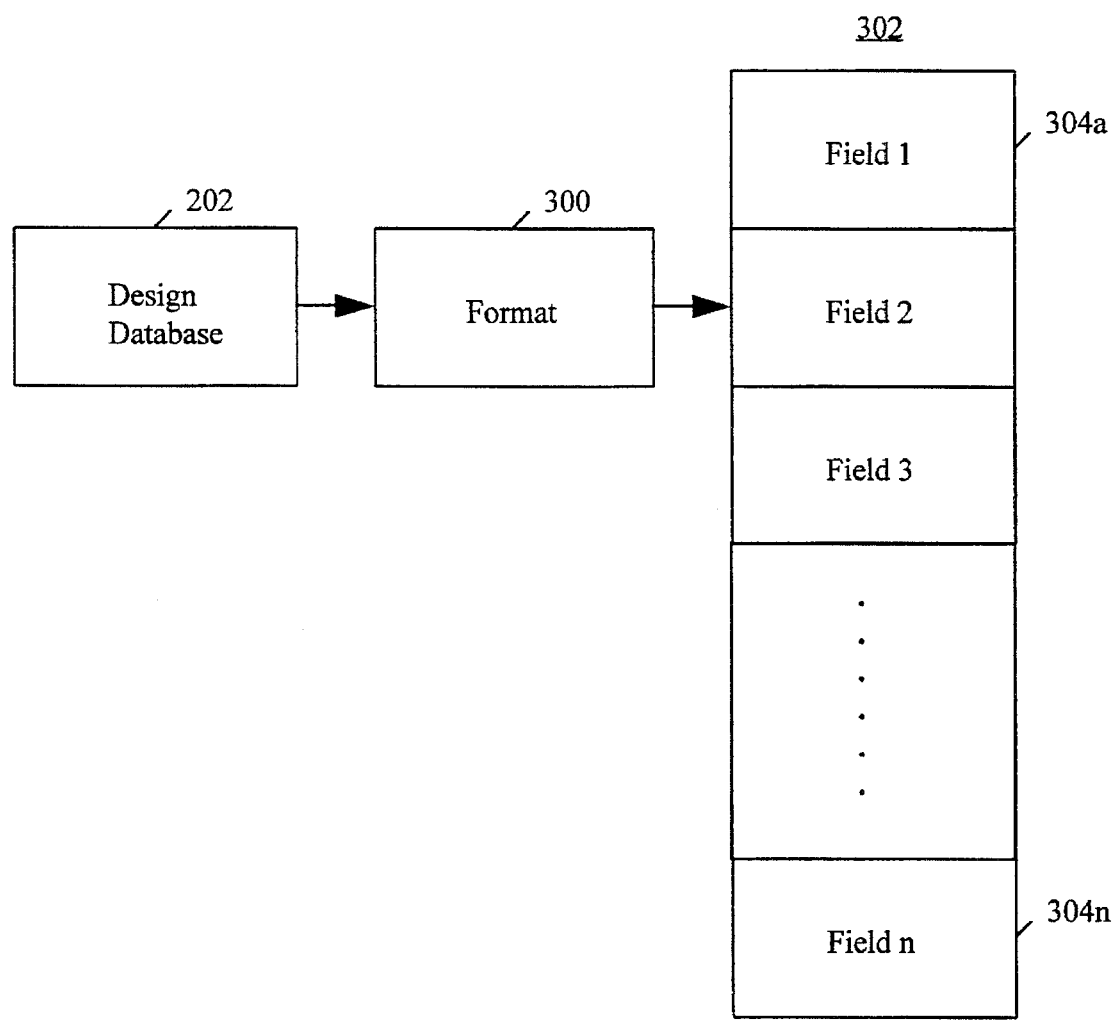
FIG. 3 is a block diagram of a data structure according to an embodiment of the invention.

FIG. 3 shows an example data structure 302 for storing the requirements datalog 218. As stated previously, the requirements datalog is derived from the design database data 202 and formatted by the requirements datalog generator 220 before being stored in data structure 302. Data structure 302 comprises a plurality of fields 304a–304n. Each field corresponds to a test to be performed on the device by the ATE. Fields 304a–304n are predefined to correspond to the formatted data. In one version of the invention, each test to be performed by the ATE is associated with a test name and one or more pertinent parameters, such as test type, test pattern name, and operating voltage.

In one embodiment, the tests are divided into two categories: functional and parametric. A functional test produces either a pass or fail result, and therefore has associated with it only the name of the test, the test pattern, and the operating voltage. A parametric test involves a measurement of current or voltage. Therefore, the measurement must be checked to determine whether it is greater than, less than, or within a range of values. Often, the parametric test depends on a particular forcing value. For example, when measuring a particular signal to insure that a "logic high" output is above the specified minimum, a current load is applied. Since pach test has parameters associated with it, there are provided embodiments of the invention in which the data structure fields are subdivided as shown in FIGS. 3A and 3B.

FIG. 3A is an example of a field subdivided for functional tests. In this embodiment the field is divided into four sub-fields 306–312. In sub-field 306, the type of the test, i.e., functional, appears. In sub-field 308, the name of the test appears, and in sub-field 310 the name of the test pattern is stored. Sub-field 312 contains the operating voltage ("VDD") at which operating voltage of the test is stored.

FIG. 3B shows a predefined data structure field subdivided for a parametric test. As shown, sub-field 314 is associated with the type of the test, and sub-fields 316 and 318 contain the test and signal names respectively. Sub-fields 319 and 320 contain limits which define a range of acceptable values for the specified parametric tests, and sub-field 322 contains the forcing value required for the test.

It is to be understood that additional test parameters may be associated with each type of testing, and that the predefined data structure fields may be further subdivided accordingly. For example, in another embodiment of the invention, there is provided a guard band field associated with the parametric tests which insures that, for the device to be considered acceptable, the measured value must fail within a certain margin of error of its design maximum level.

Figure 4:
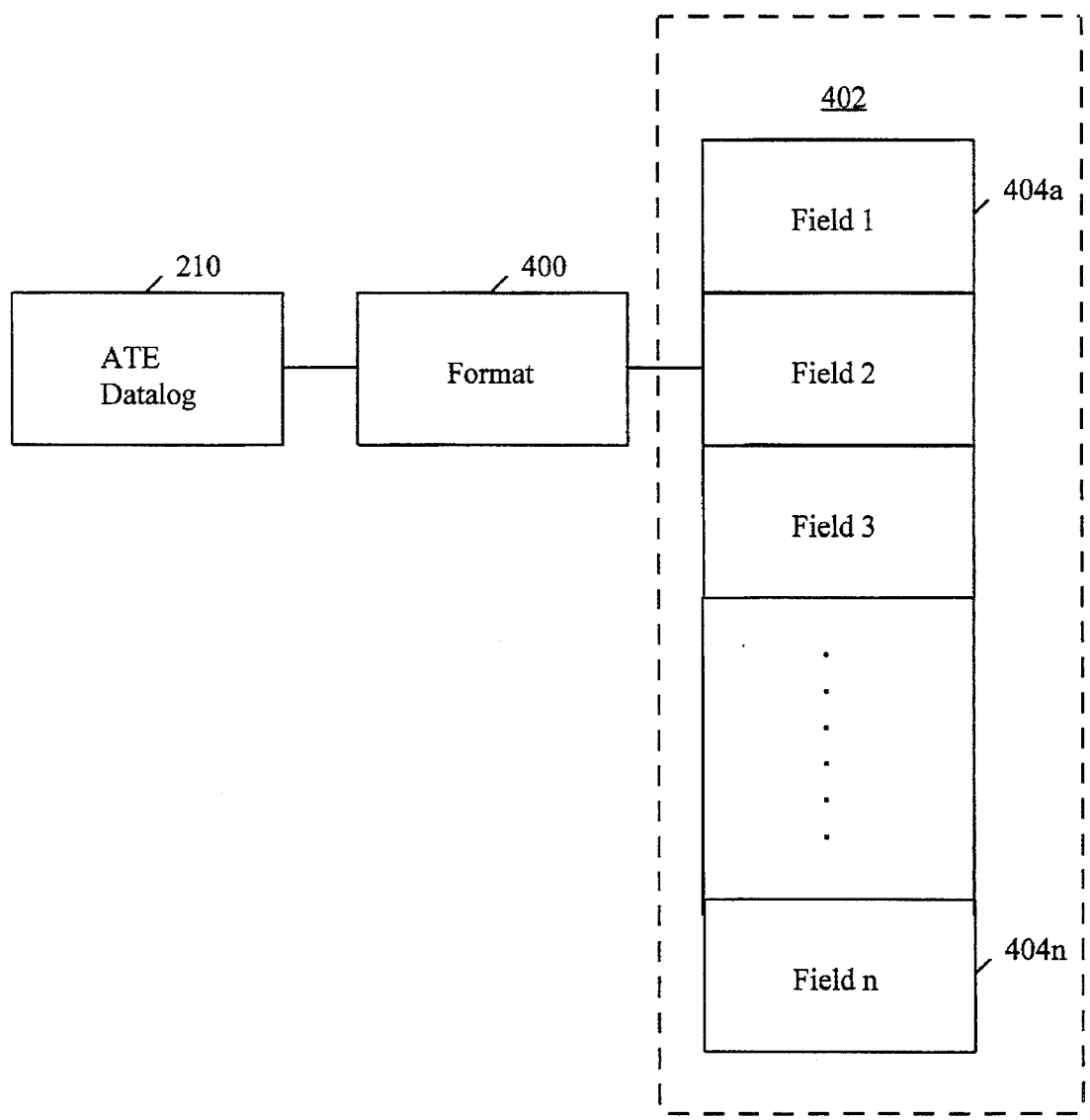
FIG. 4 is a block diagram of a data structure according to another embodiment of the invention.

Referring again to FIG. 2, it is seen that, according to further embodiments of the invention, there is provided a standard datalog generator 212 which receives the ATE test datalog 210 and generates a standard datalog 214. In one embodiment of the invention, the structure and operation of the standard datalog generator 212 is substantially the same as that of the datalog requirements generator 220. In this case, the standard datalog 214 is stored in a data structure which is substantially a mirror image of the data structure used to store the requirements datalog data 218. This is shown in FIG. 4. However, it is understood that the requirements datalog data is derived from the design database data 202, while the standard datalog data 214 is derived from actual measurements of the device from the ATE datalog 210. Consequently, the data structure containing information from the requirements datalog 218 is a representation of how the device should perform each test, while the data structure containing information from the standard datalog 214 is a representation of how the device actually performed each test. Therefore, by comparing the data structures it is possible to determine whether the device performs in conformance to the design requirements. This comparison is performed by the test result verification circuit 216.

It is to be understood that, according to other embodiments, the first and second data structures are not mirror images. For example, as each field in a data structure generated by the data requirements generator 220 corresponds to a test performed by the ATE, then there will naturally be a one-to-one correspondence to similar information stored in the ATE datalog 210. In this version of the invention, it is not necessary to convert the data stored in the tester datalog into a standard datalog. Rather it is only necessary to load the tester datalog 210 into some other structure, and through programming techniques known to those of skill in the art such as memory pointer manipulation, compare the fields in the first data structure with the corresponding field in the ATE datalog structure. However, it should be noted that ATE's manufactured by different manufacturers often produce ATE data logs of differing formats. Therefore, if the datalog data is not "standardized" into a standard datalog, then it is necessary to adjust the test result verification circuit accordingly.

The test result verification circuit 216 compares the requirements datalog 218 with the standard datalog 214. In one version of the invention, the data structures storing these respective datalogs are mirror images. Therefore, determining whether the semiconductor device conforms to design requirements is a simple matter of comparing each field in the first data structure with the corresponding field in the second data structure. For example, in a functional test, there should be an exact match between the data in the two fields. With respect to a parametric test, the data in the second data structure, derived from the ATE datalog, should fall within the parameters stored in the corresponding second data structure, derived from the datalog requirements. If a comparison of the two data structures indicates that the device has performed satisfactorily in all tests, then a conformance signal indicating the acceptability of the device is generated. Similarly, if the device has not performed satisfactorily in a test, then the conformance signal indicates that the device is defective.

The exact form taken by the conformance indication is not critical, and many techniques will occur to those of skill in the art. For example, in one embodiment, the conformance indication is simply a display on a CRT screen informing an operator of the status of the tested device. Alternately, the conformance indication is used to control automatic production equipment such that, if a device is found to be defective, then it is automatically disposed of without further input from an operator.

Figure 5:
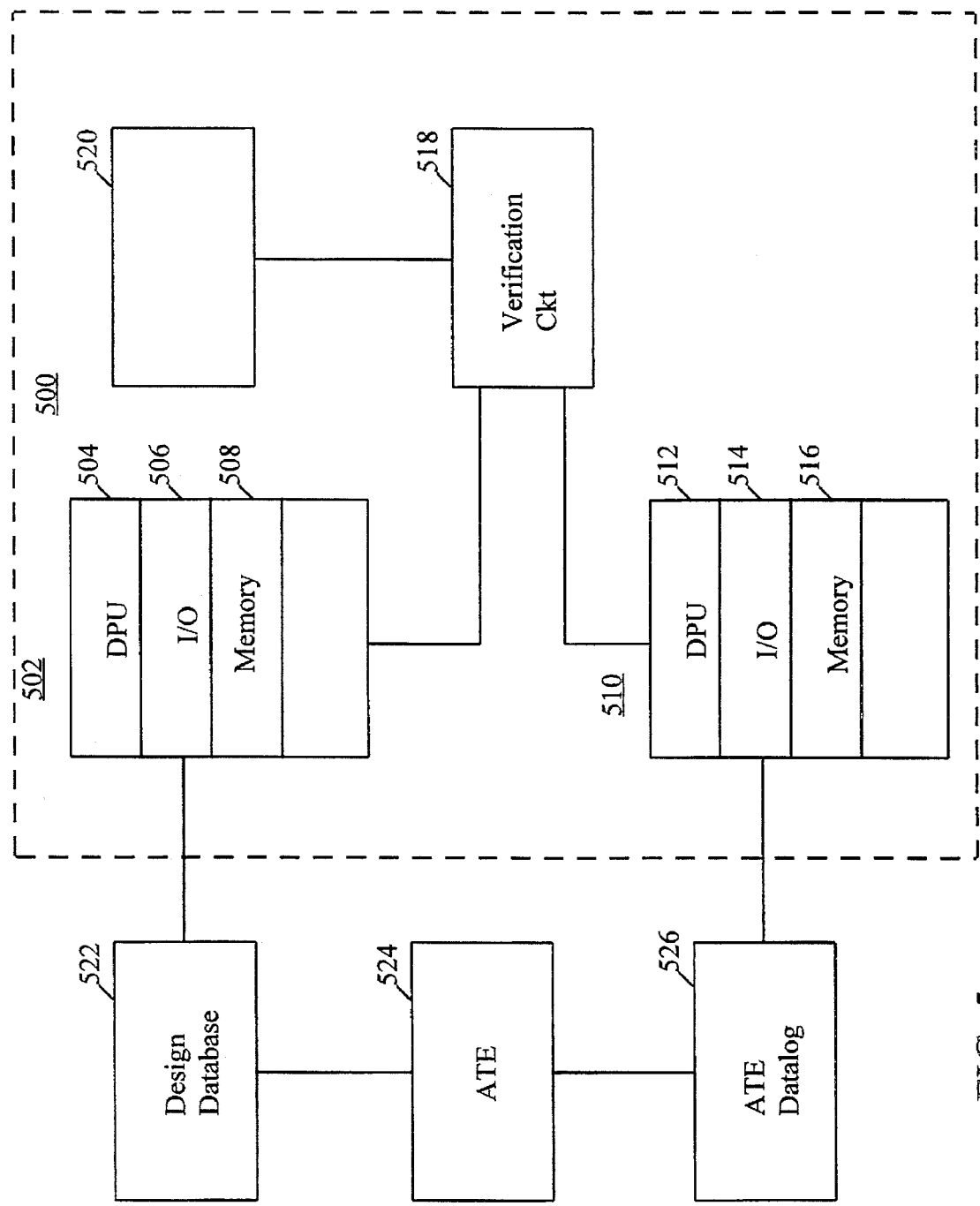
FIG. 5 is a block diagram of a system according to still a further embodiment of the invention.

FIG. 5 shows a block diagram according to another embodiment of the invention. In this embodiment there is provided a computer-based system for testing a semiconductor device, the system being responsive to a design database 522 and an automatic test equipment datalog 526 and comprising a datalog requirements generator 502 responsive to the design database 522, a standard datalog generator 510 responsive to the automatic test equipment datalog 526, and a verification circuit 518 responsive to the requirements datalog and the standard datalog. A verification circuit 518 produces a device conformance indication to operator interface 520.

In a further embodiment, the datalog requirements generator 502 comprises a retrieval circuit, such as I/O, or data retrieval circuitry 506 which retrieves data from the design database 522, and a data processing unit 504 which formats the design database data and stores the formatted design database data into a first memory structure in memory 508. An example of a hardware platform useful in this embodiment is a SPARC workstation manufactured by Sun Microsystems.

In a further embodiment, the datalog requirements generator 502 also comprises a means, responsive to the design database data 522 for determining a plurality of tests performed by the ATE 524. These tests have been described previously. An example of a means useful for determining the plurality of tests to be performed by the ATE is a determination algorithm based on pin function or circuit configuration. According to another embodiment, the means for determining which tests are performed by the ATE may be performed by a test engineer providing manual input to the tester. In another embodiment, the datalog requirements generator also comprises a means for categorizing each test into a test type. An example of such categorization is defining each test into either a functional or parametric test type. Another example category is mathematically, or statistically defined. In still a further embodiment of the invention, the datalog requirements generator 502 comprises a means for assigning a test name to each test. An example of a suitable means for assigning a test name to each test is a routine based on a description of functionality. In still a further embodiment, the datalog requirements generator comprises a means for assigning acceptable test parameters, i.e., a device parameters that a commercially acceptable device is expected to meet, to each test name. Referring still to FIG. 5, in a further version of the invention, the standard datalog generator 510 comprises a retrieval circuit, such as I/O circuitry, 512 which retrieves data from the ATE datalog 526. As with the datalog requirements generator, such I/O circuitry is known to those of skill in the art, and may comprise reading information from a magnetic memory, or computer communications from the ATE 524 to the standard datalog generator 510. In yet a further embodiment, the standard datalog generator 510 comprises a data processing unit 512 which formats the ATE datalog data, and stores the formatted ATE datalog data into a second memory 516. In yet a further embodiment of the invention, the standard datalog generator further comprises means, responsive to the ATE datalog data, for determining a plurality of tests to be performed by the ATE, means for categorizing each test into a test type, and means for assigning a test name to each test, and means for assigning test result parameters to each test name. Those of skill in the art will understand that the above example embodiments discussed in connection with the datalog requirements generator are equally applicable to the standard datalog generator. Moreover, it is understood that different combinations of hardware may be used in constructing a computer based system 500 as described herein, and that the computer based system may comprise multiple computer platforms with separate DPU's or a single computer platform executing a software program as described herein. For example, in another embodiment the requirements datalog and the standard datalog are recorded in the form of files and stored on a magnetic disk. These files may be then transferred to a stand alone computer system which compares the data stored in the files and provide an output to a computer operator indicating the status of the device tested.

While the invention has been shown and illustrated with reference to particular embodiments, it will be understood by those of skill in the art that various modifications may be made without departing from the spirit of the invention and scope of the appended claims.

What is claimed is:

1. A method useful in a computer system having a data processing unit operative with a memory, data retrieval circuitry and a user interface to determine whether a semiconductor device conforms to design requirements based on data stored in a design database and an automatic test equipment ("ATE") data log, the method comprising:

retrieving design database data from the design database;

retrieving ATE data from the automatic test equipment ("ATE") datalog, the ATE data being generated by a test program executed on the ATE which applies test data to the semiconductor device, the test program being responsive to the design database data;

generating a standard datalog responsive to the ATE data such that the standard datalog represents actual data produced by the semiconductor device in response to the test data applied to the semiconductor device by the ATE;

generating a requirements datalog from the design database data such that a one-to-one correspondence exists between each test performed by the ATE and verification data in the requirements datalog whereby the verification data represents data to verify that the actual data produced by the semiconductor device conforms to design requirements;

comparing the requirements datalog to the standard datalog to determine whether the semiconductor device conforms to design requirements.

2. A method as in claim 1 wherein generating a requirements datalog comprises:

establishing a first data structure having a first plurality of predefined fields;

formatting the design database data in accordance with the first data structure;

storing the formatted design database data into the first data structure.

3. A method as in claim 2 wherein the first plurality of predefined fields comprises:

a first plurality of name fields, each name field being associated with a test performed by an ATE;

a first plurality of parameter fields for storing design parameters, each parameter field being associated with a name field.

4. A method as in claim 3 wherein generating a standard datalog comprises:

establishing a second data structure having a second plurality of predefined fields, the second plurality of predefined fields corresponding to the first plurality of predefined fields;

formatting the ATE data in accordance with the second data structure;

storing the formatted ATE data into the second data structure.

5. A method as in claim 4 wherein the second plurality of predefined fields comprises:

a second plurality of name fields, each name filed being associated with a test performed by the ATE;

a second plurality of parameter fields for storing ATE test result parameters, each parameter field being associated with a name field.

6. A method as in claim 5 wherein generating a conformance indication comprises:

comparing the formatted design database data stored in the first data structure with the formatted ATE data stored in the second data structure;

generating a signal to the user interface indicating whether the device conforms to design requirements based on the comparison.

7. A computer-based system, having a data processing unit operative with a memory, data retrieval circuitry, and a user interface, for testing a semiconductor device, the system being responsive to a design database and an automatic test equipment ("ATE") datalog and comprising:

a datalog requirements generator responsive to the design database which generates a requirements datalog from the design database such that a one-to-one correspondence exists between each test performed by the ATE and verification data in the requirements datalog, whereby the verification data represents data to verify that actual data produced by the semiconductor device conforms to design requirements;

a standard datalog generator responsive to the automatic test equipment datalog which generates a standard datalog such that the standard datalog represents the actual produced by the semiconductor device in response to the test data applied to the semiconductor device by the ATE;

a verification circuit which compares the requirements datalog and the standard datalog to produce a device conformance indication.

8. A system as in claim 7 wherein the datalog requirements generator comprises:

a retrieval circuit which retrieves data from the design database;

a data processing unit which formats the design database data and stores the formatted design database data into a first memory structure.

9. A system as in claim 8 wherein the datalog requirements generator further comprises:

means, responsive to the design database data, for determining a plurality of tests performed by an ATE;

means for categorizing each test into a test type;

means for assigning a test name to each test;

means for assigning acceptable test parameters to each test name.

10. A system as in claim 9 wherein the standard datalog generator comprises:

a retrieval circuit which retrieves data from the ATE datalog;

a data processing unit which formats the ATE datalog data and stores the formatted ATE datalog data into a second memory.

11. A system as in claim 10 wherein the standard datalog generator further comprises:

means, responsive to the ATE datalog data, for determining a plurality of tests performed by the ATE;

means for categorizing each test into a test type;

means for assigning a test name to each test;

means for assigning test result parameters to each test name.

\* \* \* \* \*